(12) United States Patent
Chang et al.

(10) Patent No.: US 11,652,149 B2
(45) Date of Patent: May 16, 2023

(54) COMMON RAIL CONTACT

(71) Applicant: Taiwan Semiconductor Manufacturing Co., Ltd., Hsinchu (TW)

(72) Inventors: Cheng-Wei Chang, Hsinchu (TW); Hong-Ming Wu, Hsinchu (TW); Chen-Yuan Kao, Hsinchu County (TW); Li-Hsiang Chao, New Taipei (TW); Yi-Ying Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 61 days.

(21) Appl. No.: 17/112,782

(22) Filed: Dec. 4, 2020

(65) Prior Publication Data

US 2022/0052168 A1 Feb. 17, 2022

Related U.S. Application Data

(60) Provisional application No. 63/076,795, filed on Sep. 10, 2020, provisional application No. 63/065,150, filed on Aug. 13, 2020.

(51) Int. Cl.
*H01L 29/417* (2006.01)
*H01L 29/40* (2006.01)
(Continued)

(52) U.S. Cl.
CPC .. *H01L 29/41775* (2013.01); *H01L 21/76859* (2013.01); *H01L 21/76877* (2013.01);
(Continued)

(58) Field of Classification Search
CPC .............. H01L 21/76877; H01L 23/5221
See application file for complete search history.

(56) References Cited

U.S. PATENT DOCUMENTS 9,520,362 B2 12/2016 Lin et al.
9,613,856 B1 4/2017 Yang et al.
(Continued)

FOREIGN PATENT DOCUMENTS

KR 20180131346 A 12/2018
KR 20190064376 A 6/2019
(Continued)

*Primary Examiner* — Farun Lu
(74) *Attorney, Agent, or Firm* — Haynes and Boone, LLP

(57) ABSTRACT

A method according to the present disclosure includes receiving a workpiece including a gate structure, a first source/drain (S/D) feature, a second S/D feature, a first dielectric layer over the gate structure, the first S/D feature, the second S/D feature, a first S/D contact over the first S/D feature, a second S/D contact over the second S/D feature, a first etch stop layer (ESL) over the first dielectric layer, and a second dielectric layer over the first ESL, forming a S/D contact via through the second dielectric layer and the first ESL to couple to the first S/D contact, forming a gate contact opening through the second dielectric layer, the first ESL, and the first dielectric layer to expose the gate structure, and forming a common rail opening adjoining the gate contact opening to expose the second S/D contact, and forming a common rail contact in the common rail opening.

20 Claims, 19 Drawing Sheets

(51) Int. Cl.
  *H01L 23/538*  (2006.01)
  *H01L 23/522*  (2006.01)
  *H01L 21/768*  (2006.01)
  *H01L 21/8234* (2006.01)
(52) U.S. Cl.
  CPC .. *H01L 21/823475* (2013.01); *H01L 23/5221* (2013.01); *H01L 23/5226* (2013.01); *H01L 23/5386* (2013.01); *H01L 29/401* (2013.01)

(56) References Cited

U.S. PATENT DOCUMENTS

| | | | |
|---|---|---|---|
| 9,716,032 B2 | 7/2017 | Tang et al. | |
| 9,972,529 B2 | 5/2018 | Yang et al. | |
| 10,083,863 B1* | 9/2018 | Hsieh | H01L 23/485 |
| 10,163,691 B2 | 12/2018 | Shih et al. | |
| 10,170,322 B1 | 1/2019 | Cheng et al. | |
| 2008/0026564 A1* | 1/2008 | Frohberg | H01L 21/76816 438/637 |
| 2016/0043035 A1* | 2/2016 | Lin | H01L 23/485 438/653 |
| 2016/0336183 A1 | 11/2016 | Yuan et al. | |
| 2019/0067436 A1 | 2/2019 | Wu et al. | |
| 2019/0157148 A1* | 5/2019 | Hsieh | H01L 21/823821 |
| 2019/0157405 A1* | 5/2019 | Huang | H01L 29/41766 |
| 2019/0164813 A1* | 5/2019 | Wang | H01L 21/76877 |
| 2019/0164829 A1* | 5/2019 | Yang | H01L 29/7851 |
| 2019/0287851 A1 | 9/2019 | Chen et al. | |
| 2019/0304833 A1 | 10/2019 | Chen et al. | |

FOREIGN PATENT DOCUMENTS

| | | |
|---|---|---|
| TW | 201327690 A1 | 4/2013 |
| TW | 201901852 A | 1/2019 |
| TW | 202006889 A | 2/2020 |

* cited by examiner

COMMON RAIL CONTACT

PRIORITY DATA

The present application claims the benefit of U.S. Provisional Application No. 63/065,150, entitled "Power Rail Formation," filed Aug. 13, 2020 and U.S. Provisional Application No. 63/076,795, entitled "Power Rail Formation," filed Sep. 9, 2020, each of which is herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, as integrated circuit (IC) technologies progress towards smaller technology nodes, source/drain contact vias and gate contact vias become smaller as well. With smaller source/drain contact vias and gate contact vias, reduction of contact resistance becomes more and more challenging. Therefore, while existing contact structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
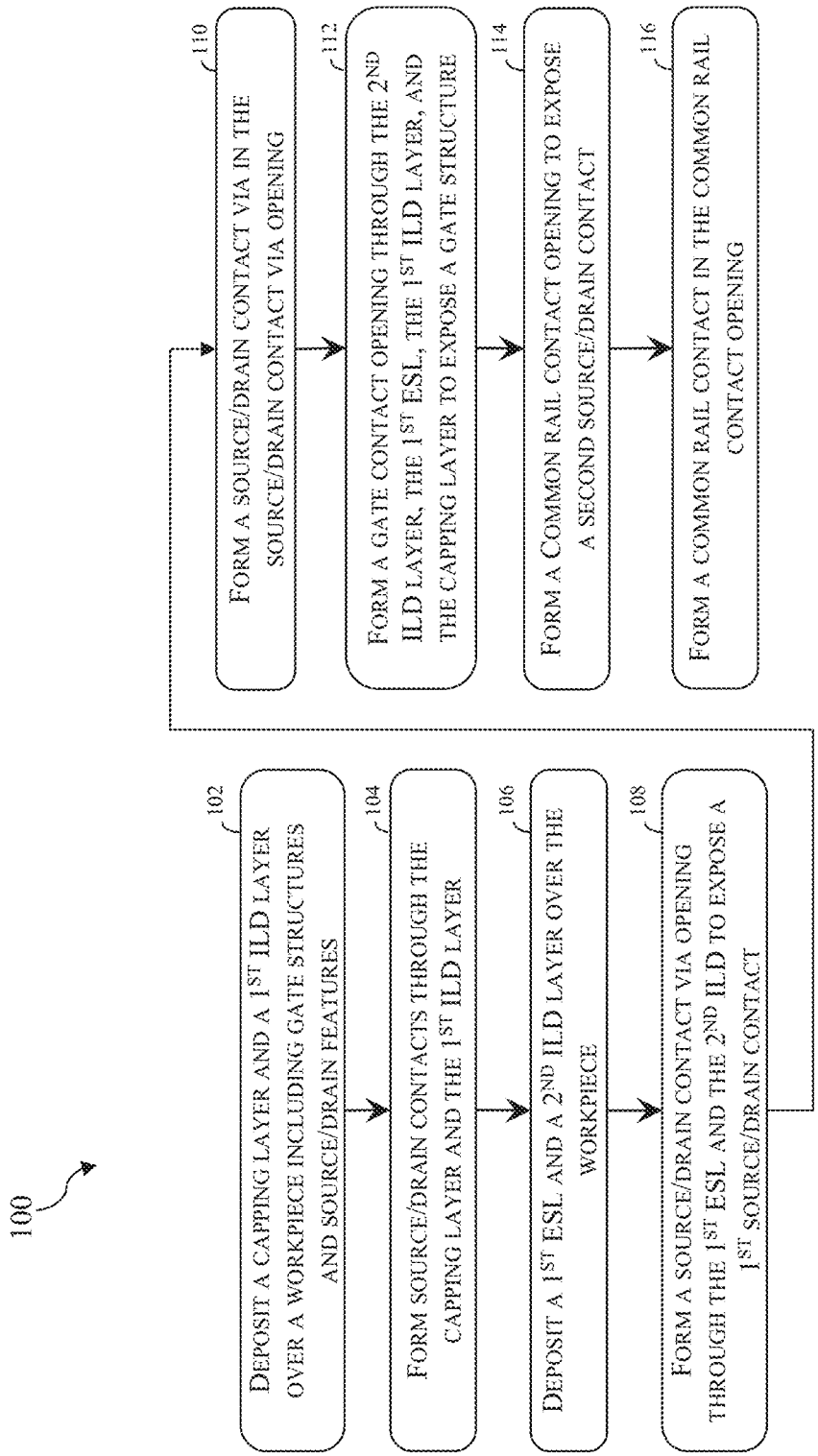
FIG. 1 is a flow chart of a method for fabricating a common rail contact, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming active regions (such as fins), gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

Conventionally, MEOL features, such as gate contacts or source/drain contact vias are all separate from one another. When a source/drain feature and an adjacent gate structure are to be shorted together, the electrical coupling does not take place in the MEOL level but in the BEOL level. The conduction path between the source/drain feature and the adjacent gate structure may therefore include multiple contacts, contact vias, and metal lines. Each of such multiple contacts, contact vias, and metal lines may include barrier layers or glue layers that are less conductive than a metal fill material, such as cobalt or tungsten. Such a long conduction path contributes to increased contact resistance. Additionally, as openings for the gate contacts or source/drain contact vias become smaller with the functional density, the metal fill window may become smaller.

The present disclosure discloses a common rail contact that is in contact with a gate structure and an adjacent source/drain contact. To form the common rail contact, a gate contact opening is formed through various dielectric layers to expose the gate structure and then a common rail opening is formed over the source/drain contact to merge with the gate contact opening. A common rail contact is then formed in the common rail opening. Due to the formation process, the common rail contact is characterized with an asymmetric profile. Before the formation of the common rail contact, a source/drain contact via may be separately formed over another source/drain contact feature, which is not shorted to an adjacent gate structure. The common rail contact reduces contact resistance and improves metal fill windows.

The various aspects of the present disclosure will now be described in more detail with reference to the figures. In that regard, FIG. 1 is a flowchart illustrating a method 100 of forming a common rail contact according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-19, which are fragmentary cross-sectional views of a workpiece 200 at different stages of fabrication according to embodiments of the method 100 in FIG. 1. For avoidance of doubts, the X, Y and Z directions in FIGS. 2-19 are perpendicular to one another and are used consistently throughout FIGS. 2-19. Because the workpiece 200 will be fabricated into a semiconductor device, the workpiece 200 may be referred to herein as a semiconductor device 200 as the context requires. Throughout the present disclosure, like reference numerals denote like features unless otherwise excepted.

Figure 2:
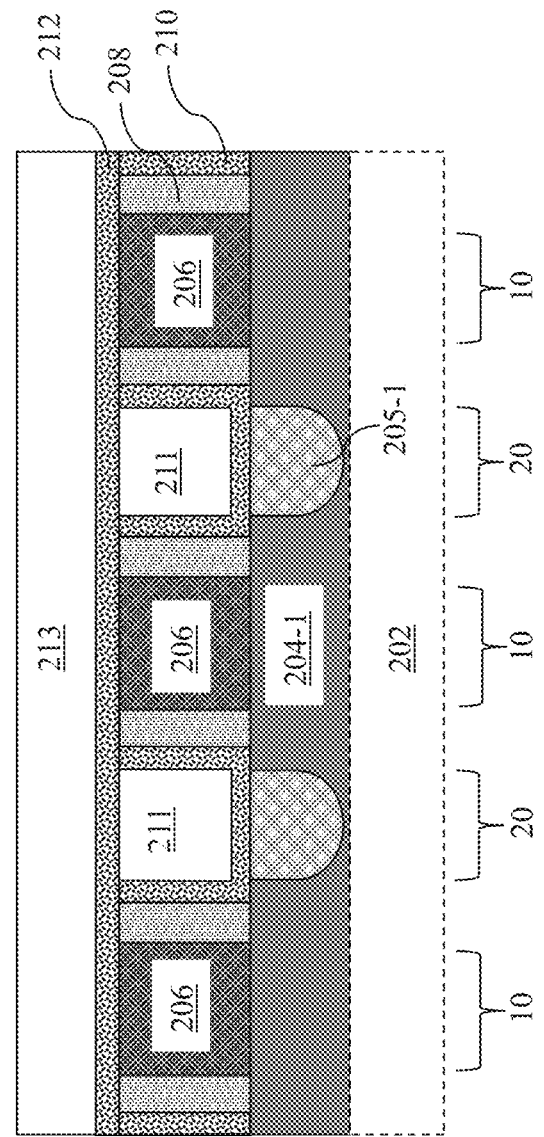
FIGS. 2-19 are fragmentary cross-sectional views of a workpiece at various stages of fabrication of the method in FIG. 1, according to various aspects of the present disclosure.

Referring to FIGS. 1 and 2, the method 100 includes a block 102 where a capping layer 212 and a first interlayer dielectric (ILD) layer 213 are deposited over a workpiece 200 that includes gate structures 206 and source/drain features. The workpiece 200 includes a substrate 202. In the depicted embodiment, substrate 202 includes silicon. Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

Figure 13:
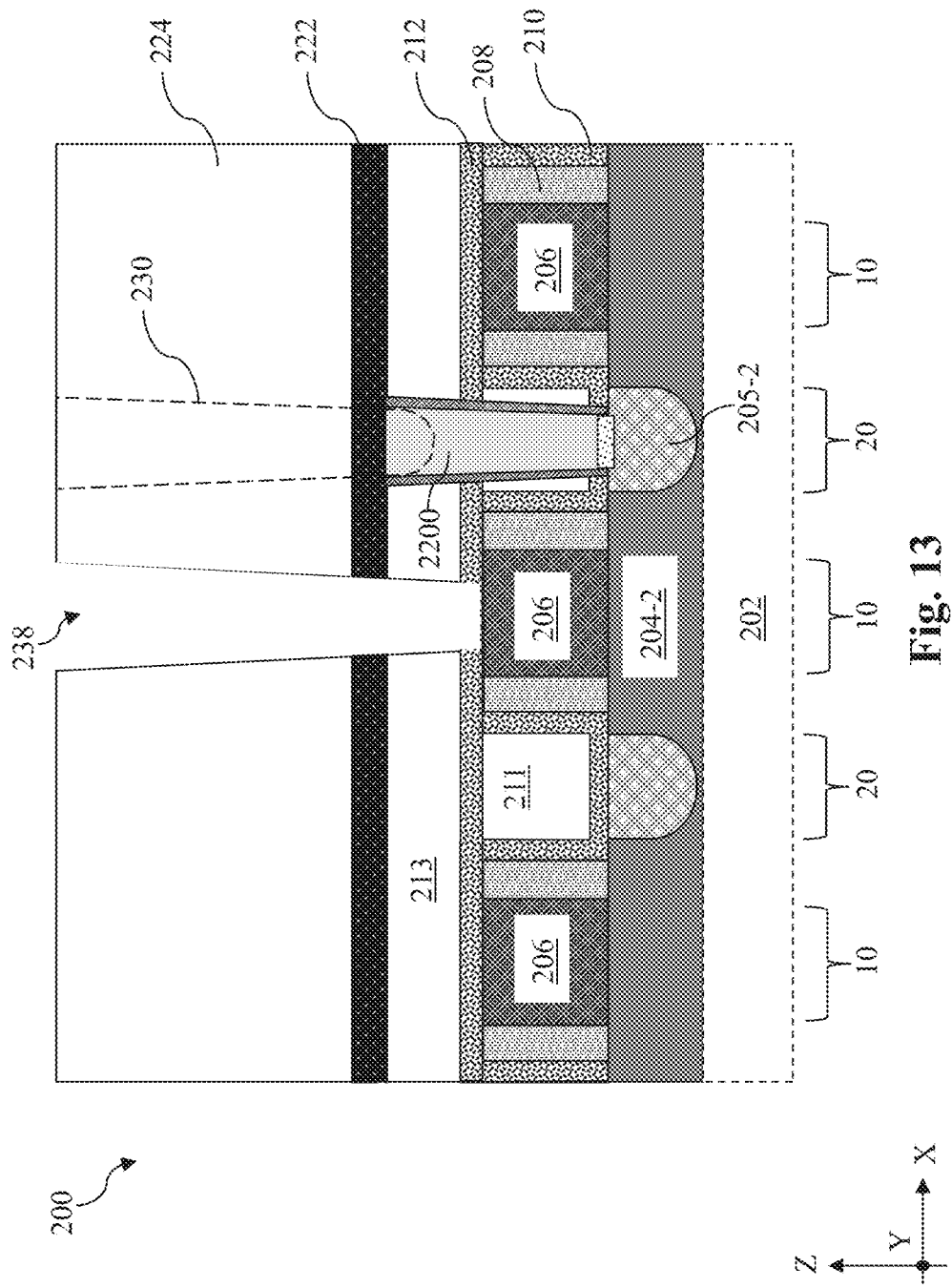

The workpiece 200 includes a plurality of fins (or fin elements). A first fin 204-1 is shown in FIG. 2 and a second fin 204-2 is shown in FIG. 13. In some embodiments, the plurality of fins may be formed from patterning a portion of the substrate 202. In some alternative embodiments, the plurality of fins may be formed from patterning one or more epitaxial layers deposited over the substrate 202. In the depicted embodiment, the first fin 204-1 is formed from patterning a portion of the substrate 202 and includes silicon (Si). Although not explicitly shown in the figures, an isolation feature may be formed between the plurality of the fins to separate adjacent fins. In some embodiments, the isolation feature may include silicon oxide, silicon nitride, silicon oxynitride, fluorine-doped silicate glass (FSG), a low-k dielectric, combinations thereof, and/or other suitable materials.

As shown in FIG. 2, the workpiece 200 further includes gate structures 206 that are disposed over channel regions 10 of the first fin 204-1. The channel regions 10 of the first fin 204-1 are interleaved by source/drain regions 20. In some implementations, gate structures 206 wrap over channel regions 10 of the first fin 204-1. Each of the channel regions 10 interpose two source/drain regions 20. While not explicitly shown in the figures, each of the gate structures 206 includes a gate dielectric layer and a gate electrode over the gate dielectric. The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide ($k \approx 3.9$). Exemplary high-k dielectric materials for the high-k dielectric layer include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. In one embodiment, the high-k dielectric layer is formed of hafnium oxide (HfO). The gate electrode may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof.

Sidewalls of the gate structures 206 are lined with at least one gate spacer 208. In some embodiments, the at least one gate spacer 208 may include silicon carbonitride, silicon oxycarbide, silicon oxycarbonitride, or silicon nitride. In some embodiments, a gate replacement or a gate last process may be used to form the gate structures 206. In an example gate last process, dummy gate stacks are formed over channel regions 10 of the first fin 204-1. The at least one gate spacer 208 is then deposited over the workpiece 200, including over sidewalls of the dummy gate stacks. An anisotropic etch process is then performed to recess the source/drain regions 20 to form source/drain trenches, leaving behind the at least one gate spacer 208 extending along sidewalls of the dummy gate stacks. After formation of the source/drain trenches, source/drain features (such as the first source/drain feature 205-1 shown in FIG. 2) are deposited into the source/drain trenches in the source/drain regions 20. The source/drain features may be formed by vapor-phase epitaxy (VPE), ultra-high vacuum CVD (UHV-CVD), LPCVD, PECVD, molecular beam epitaxy (MBE), or other suitable epitaxy processes, or combinations thereof. The source/drain features may also be referred to as epitaxial features. Depending on the design of the semiconductor device 200, source/drain features may be n-type or p-type. When the source/drain features are n-type, they may include silicon (Si) doped with an n-type dopant, such as phosphorus (P) or arsenic (As). When the source/drain features are p-type, they may include silicon germanium (SiGe) doped with a p-type dopant, such as boron (B) or gallium (Ga). In some implementations, annealing processes may be performed to activate dopants in source/drain features of the semiconductor device 200.

In the depicted embodiments, the first source/drain feature 205-1 may include phosphorus-doped silicon (Si:P) or boron-doped silicon germanium (SiGe:B).

After the formation of the source/drain features, a contact etch stop layer (CESL) 210 and a bottom interlayer dielectric (ILD) layer 211 are deposited over the workpiece 200. In some embodiments, the CESL 210 includes a silicon nitride layer, a silicon oxynitride layer, and/or other materials known in the art. The CESL 210 may be deposited using atomic layer deposition (ALD), plasma-enhanced ALD (PEALD), plasma-enhanced chemical vapor deposition (PECVD), and/or other suitable deposition processes. The bottom ILD layer 211 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The bottom ILD layer 211 may be deposited by CVD, spin-on coating, or other suitable deposition technique. The workpiece 200 is then planarized using a chemical mechanical polishing (CMP) process to expose the dummy gate stacks. The dummy gate stacks are then removed and replaced with the gate structures 206, the composition of which is described above.

At block 102, the capping layer 212 and the first interlayer dielectric (ILD) layer 213 are sequentially deposited over the workpiece 200. Because the capping layer 212 is disposed over top surfaces of the gate structures 206, the capping layer 212 may also be referred to as gate-top capping layer 212 or a gate-top etch stop layer 212. In some instances, the first ILD layer 213 includes a thickness along the Z direction and the thickness is between about 11 nm and about 20 nm. The composition and formation of the capping layer 212 may be similar to those of the CESL 210 and the composition and formation of the first ILD layer 213 may be similar to those of the bottom ILD layer 211. Detailed description of the capping layer 212 and the first ILD layer 213 are therefore omitted for brevity.

Figure 3:
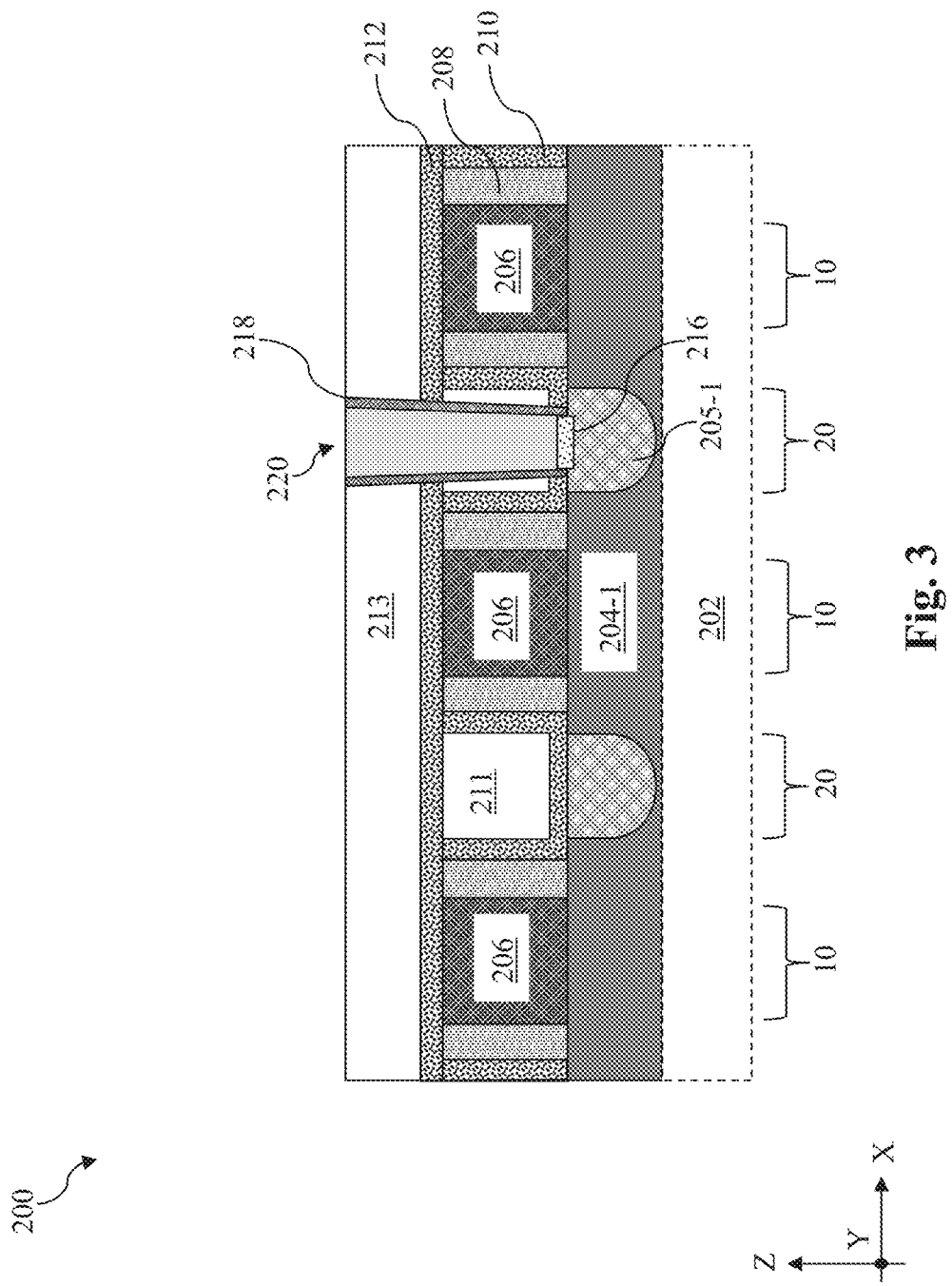

Referring now to FIGS. 1 and 3, the method 100 includes a block 104 where source/drain contacts are formed through the capping layer 212 and the first ILD layer 213 to couple to the source/drain features. The source/drain contacts may include the first source/drain contact 220 over the first source/drain feature 205-1, as shown in FIG. 3, and a second source/drain contact 2200 over a second source/drain feature 205-2, as shown in FIG. 13. Operations at block 104 will be described with respect to the first source/drain contact 220 but the same operations apply to the second source/drain contact 2200. Block 104 includes formation of a source/drain contact opening through the first ILD layer 213, the capping layer 212, the bottom ILD layer 211, and the CESL 210 as well as deposition of the first source/drain contact 220 in the source/drain contact opening. The formation of the source/drain contact opening may include use of lithography processes and/or etching processes. In some implementations, the lithography processes include forming a resist layer over the first ILD layer 213, exposing the resist layer to pattern radiation, and developing the exposed resist layer, thereby forming a patterned resist layer that can be used as a masking element for etching the source/drain contact opening to expose at least a portion of the first source/drain feature 205-1. The etching processes may include a dry etch process that includes use of a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a hydrocarbon species (e.g. $CH_4$), a bromine-containing gas (e.g., HBr and/or $CHBr_3$), an iodine-containing gas, other suitable gases and/or plasmas, and/or combinations thereof. After the formation of the source/drain contact opening, a silicide feature 216 and a barrier layer 218 are formed in the source/drain contact opening. In some instances, the silicide feature 216 may include titanium silicide, cobalt silicide, nickel silicide, tantalum silicide, or tungsten silicide. The barrier layer 218 may include a metal or a metal nitride, such as a titanium nitride, cobalt nitride, nickel, tungsten nitride. Thereafter, a metal fill layer is deposited over the barrier layer 218 to form the first source/drain contact 220. The metal fill layer may include tungsten (W), ruthenium (Ru), cobalt (Co), nickel (Ni), or copper (Cu). In the depicted embodiment, the first source/drain contact 220 includes cobalt (Co). After the deposition of the metal fill layer, a CMP process may be performed to remove excess materials and define the final shape of the first source/drain contact 220.

Figure 4:
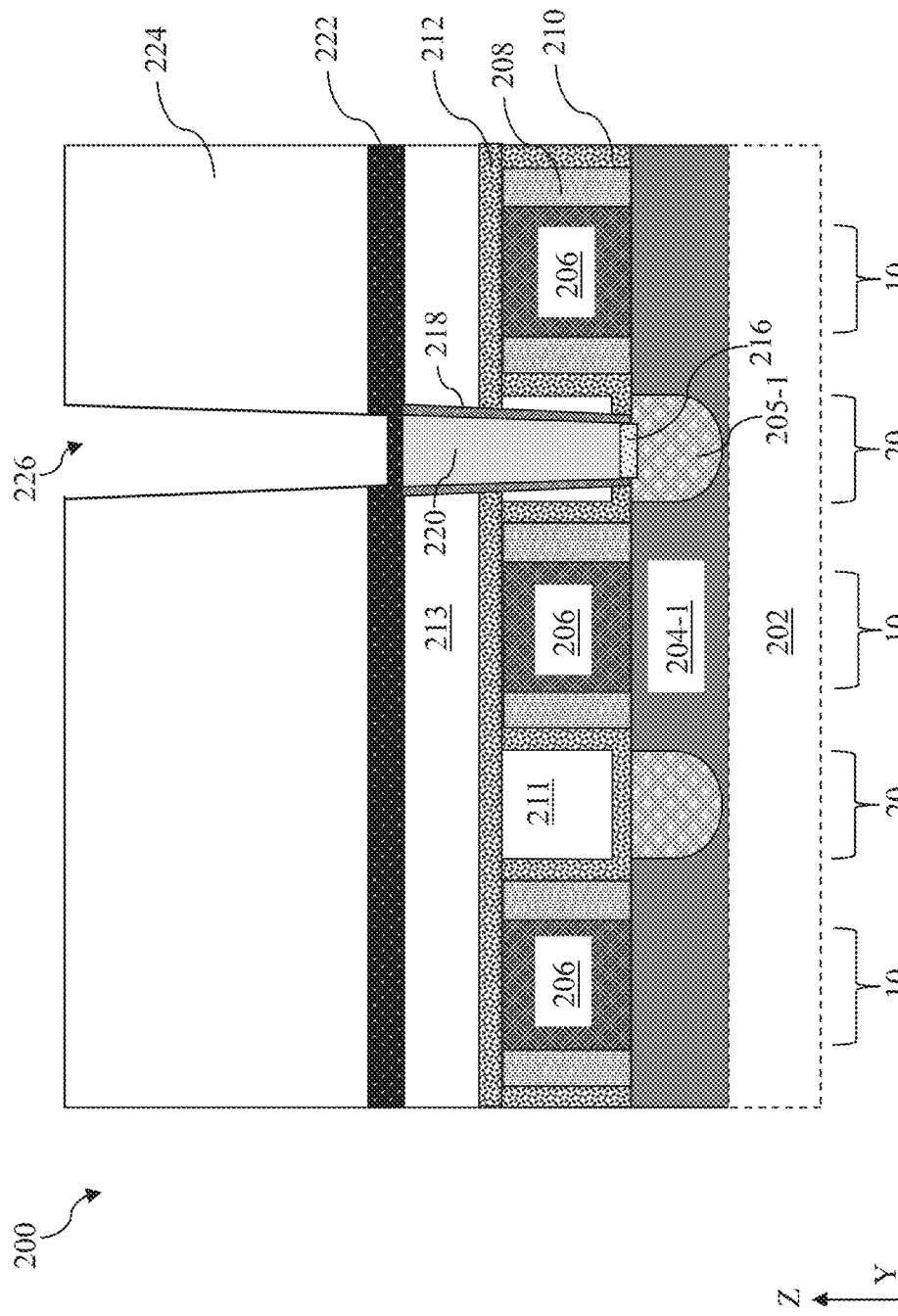

Referring now to FIGS. 1 and 4, the method 100 includes a block 106 where a first etch stop layer (ESL) 222 and a second interlayer dielectric (ILD) layer 224 are deposited over the workpiece 200. In some instances, the first ESL 222 may have a thickness along the Z direction between about 8 nm and about 13 nm. In some embodiments, the composition and formation of the first ESL 222 may be similar to those of the CESL 210 and the composition and formation of the second ILD layer 224 may be similar to those of the bottom ILD layer 211. Detailed description of the first ESL 222 and the second ILD layer 224 are therefore omitted for brevity.

Figure 5:
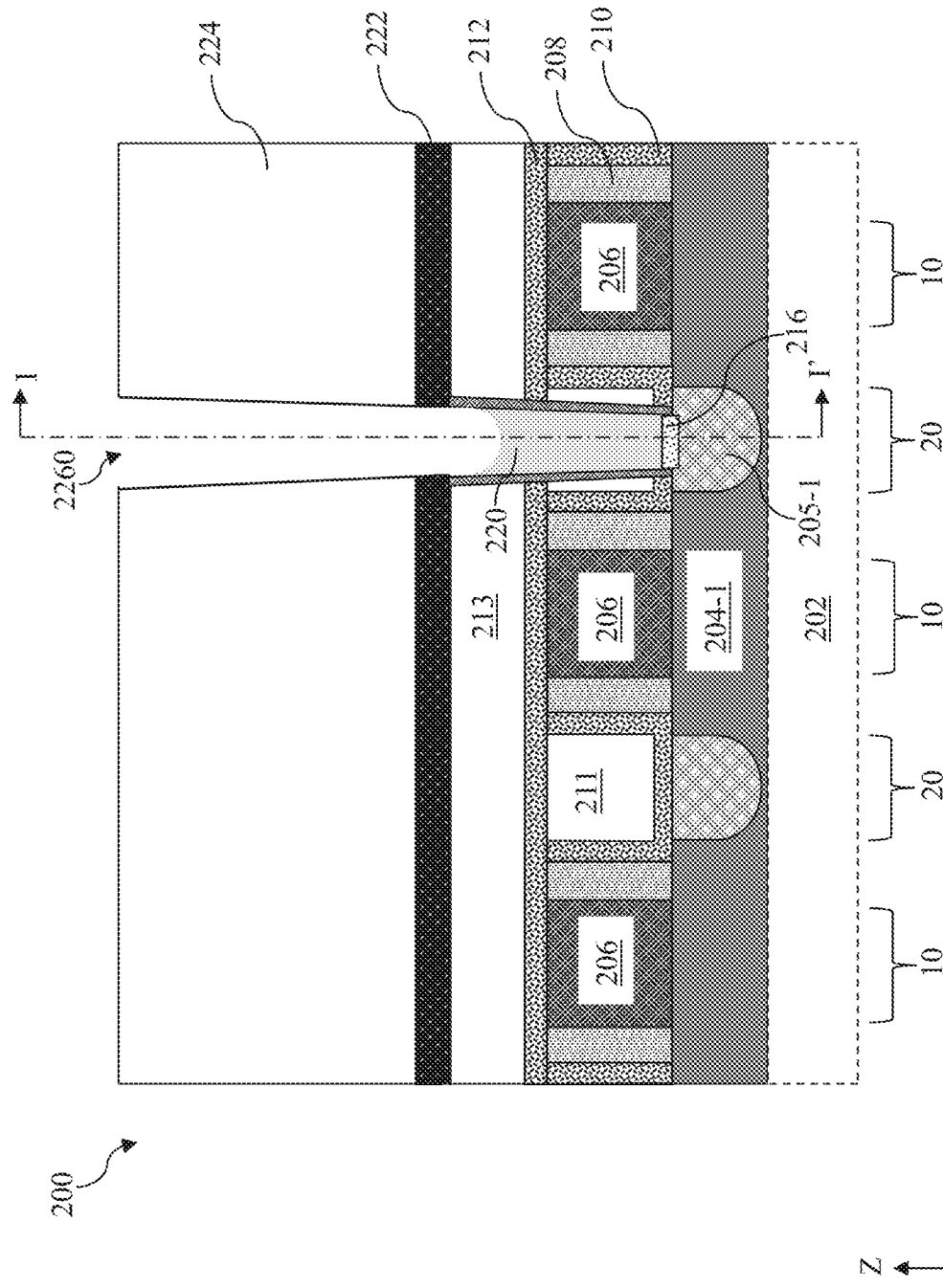
Figure 6:
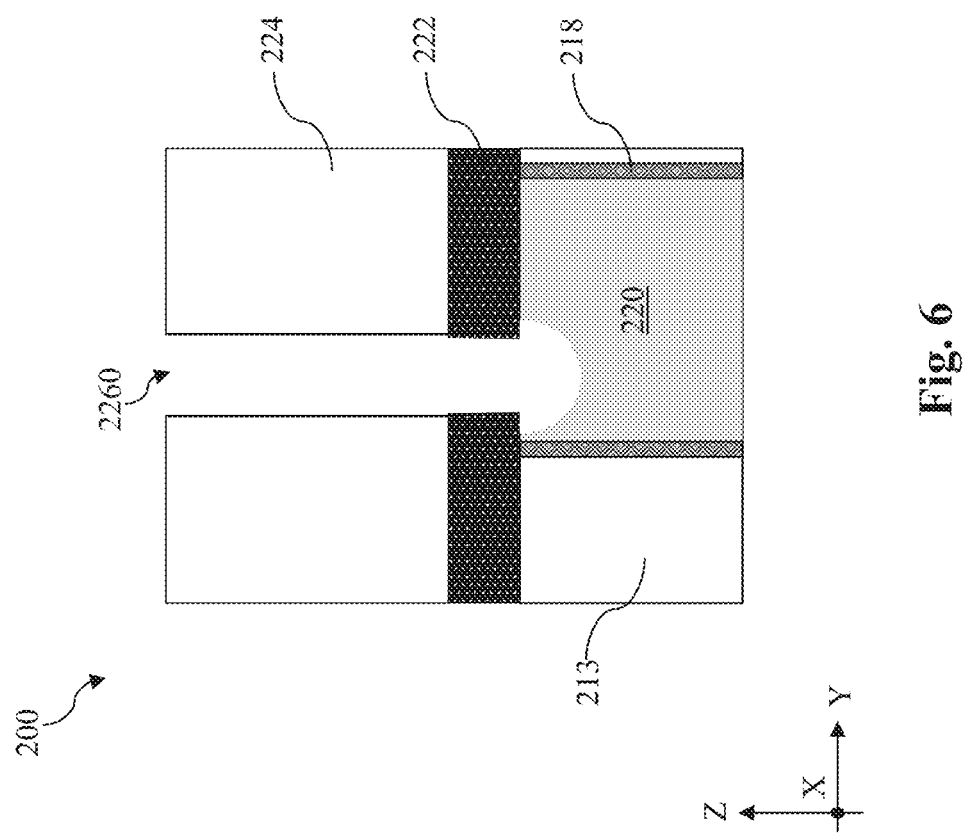

Referring to FIGS. 1, 4, 5, and 6, the method 100 includes a block 108 where a source/drain contact via opening 2260 is formed through the first ESL 222 and the second ILD layer 224 to expose the first source/drain contact 220. Operations at block 108 may include formation of a pilot opening 226 (shown in FIG. 4) and extending the pilot opening 226 to form the source/drain contact via opening 2260 (shown in FIGS. 5 and 6). The formation of the pilot opening 226 may include photolithography processes and etch processes. The photolithography processes form an etch mask that includes an opening over the first source/drain contact 220. Referring to FIG. 4, a dry etch process then performed to etch completely through the second ILD layer 224 and at least a portion of the first ESL 222. In some embodiments, after the dry etch process, the first source/drain contact 220 may remain covered by a portion of the first ESL 222. In some other embodiments, the first source/drain contact 220 is exposed in the pilot opening 226. An example dry etch process for block 108 may include use of nitrogen ($N_2$), hydrogen ($H_2$), a hydrocarbon species (e.g. $CH_4$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In one embodiment, the pilot opening 226 is etched using a nitrogen plasma, a hydrogen plasma, or both. Reference is now made to FIG. 5. A selective wet etch process may be performed to selectively recess the first source/drain contact 220 to extend the pilot opening 226, thereby forming the source/drain contact via opening 2260. In some implementations, the selective wet etch process includes use of deionized (DI) water, 2-anilino-4-methyl-1,3-thiazole-5-carboxylic acid, nitric acid, hydrogen peroxide, hydrochloride, or isopropyl alcohol (IPA). FIG. 6 illustrates a fragmentary cross-sectional view along section I-I'. As shown in FIG. 6, due to the use of the wet etch process, the source/drain contact via opening 2260 may undercut the first ESL 222.

Figure 7:
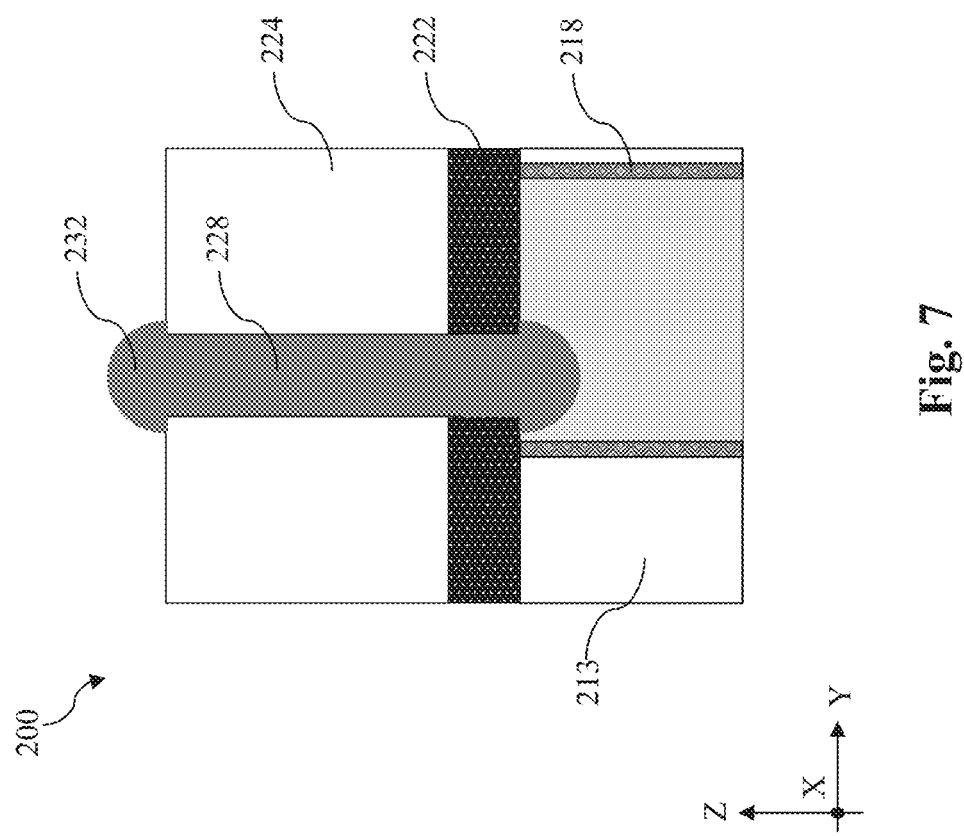
Figure 8:
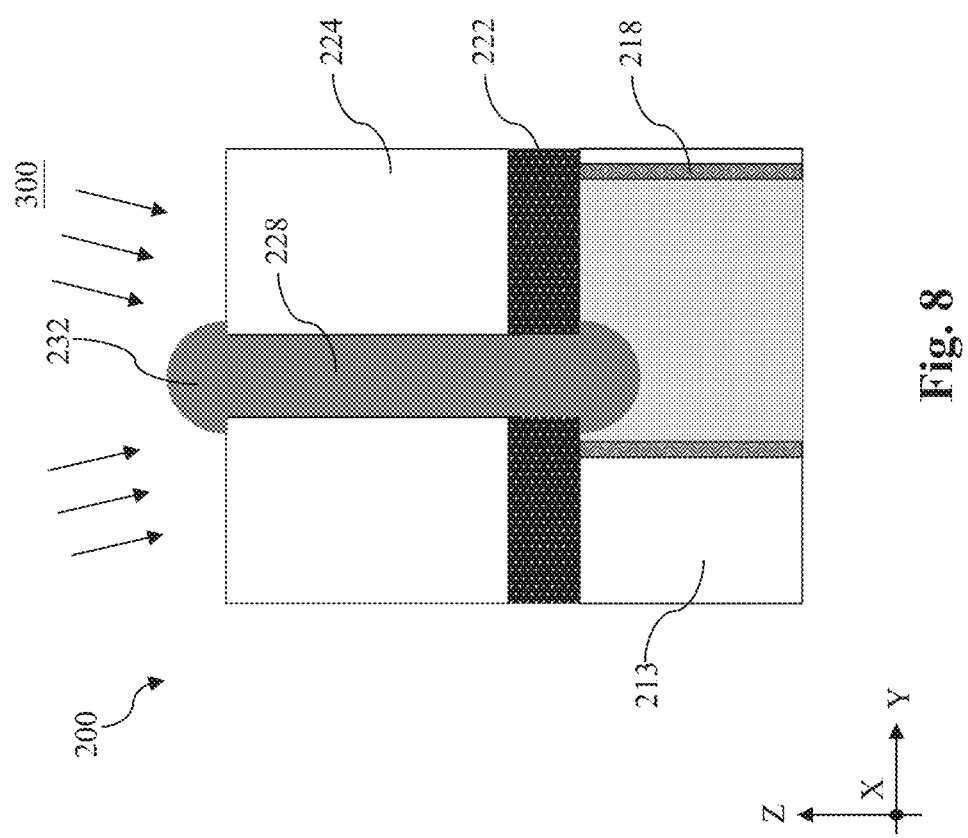

Referring to FIGS. 1 and 7-12, the method 100 includes a block 110 where a source/drain contact via 230 is formed in the source/drain contact via opening 2260. Operations at block 110 may include metal deposition (shown in FIG. 7), a first implantation process 300 (shown in FIG. 8), deposition of a first glue layer 234 (shown FIG. 9), deposition of a buffer layer 236 (shown in FIG. 10), a planarization process (shown in FIG. 11), a second implantation process 400 (shown in FIG. 11). Referring to FIG. 7, a metal fill layer 228 is deposited into the source/drain contact via opening 2260. In some embodiments, the metal fill layer 228 may include tungsten (W) or ruthenium (Ru). In the depicted embodiment, the metal fill layer 228 includes tungsten (W). In some implementation, the metal fill layer 228 may be deposited in a bottom-up manner using pulsed CVD or a suitable deposition technique. As shown in FIG. 7, the bottom-up deposition of the metal fill layer 228 may result in a mushroom-like top 232 that rises above the second ILD layer 224. Referring now to FIG. 8, after the deposition of the metal fill layer 228, the first implantation process 300 is performed to reinforce the interface between the metal fill layer 228 and the second ILD layer 224. In some embodiments, the first implantation process 300 implants a semiconductor material, such as germanium (Ge). The implantation process 300 functions to improve the adhesion of the metal fill layer 228 to the second ILD layer 224 to prevent slurry of a subsequent CMP process from reaching the first source/drain contact 220 along the interface between the second ILD layer 224 and the source/drain contact via 230 (shown in FIG. 11 or 12).

Figure 9:
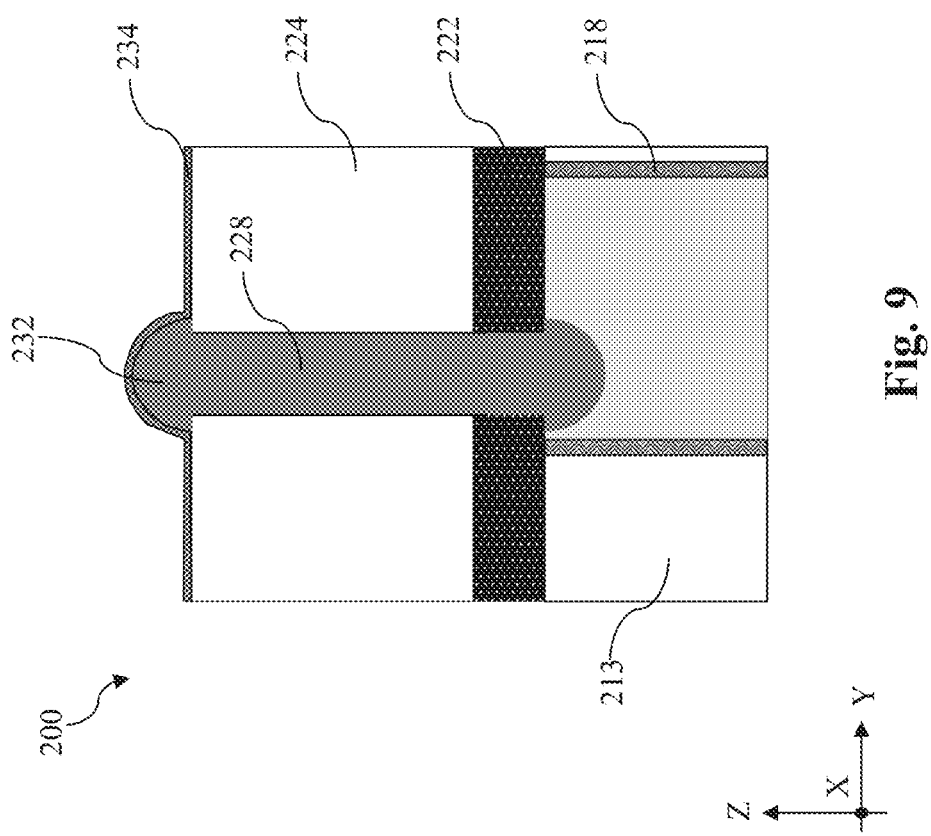
Figure 10:
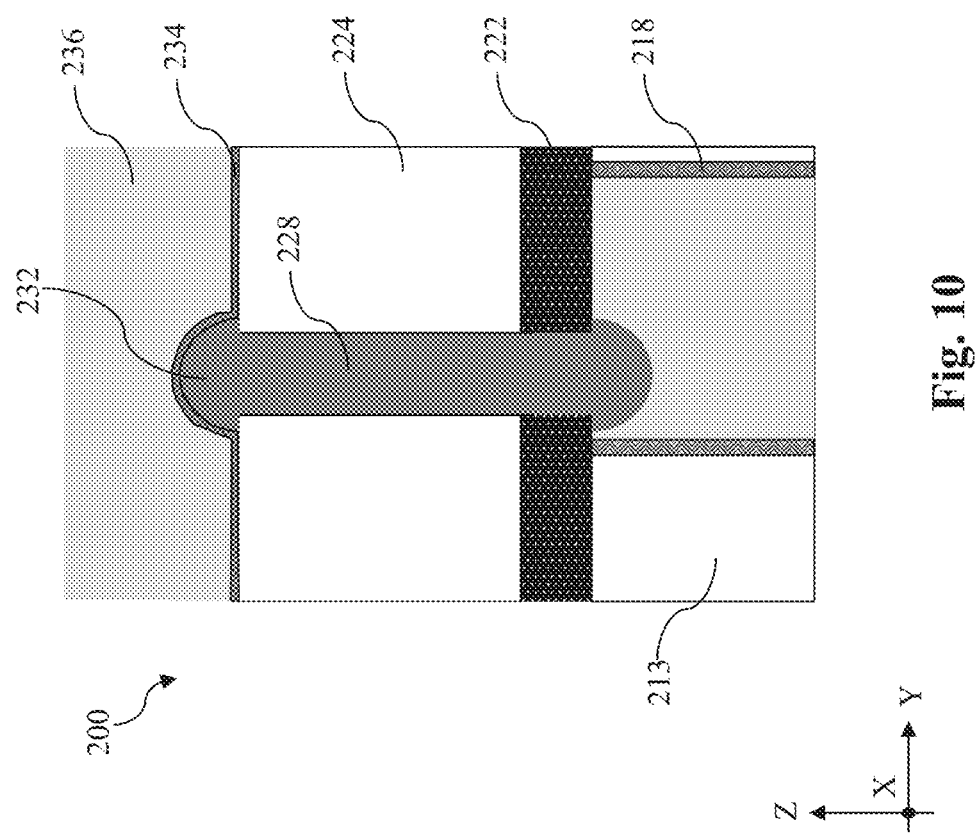
Figure 11:
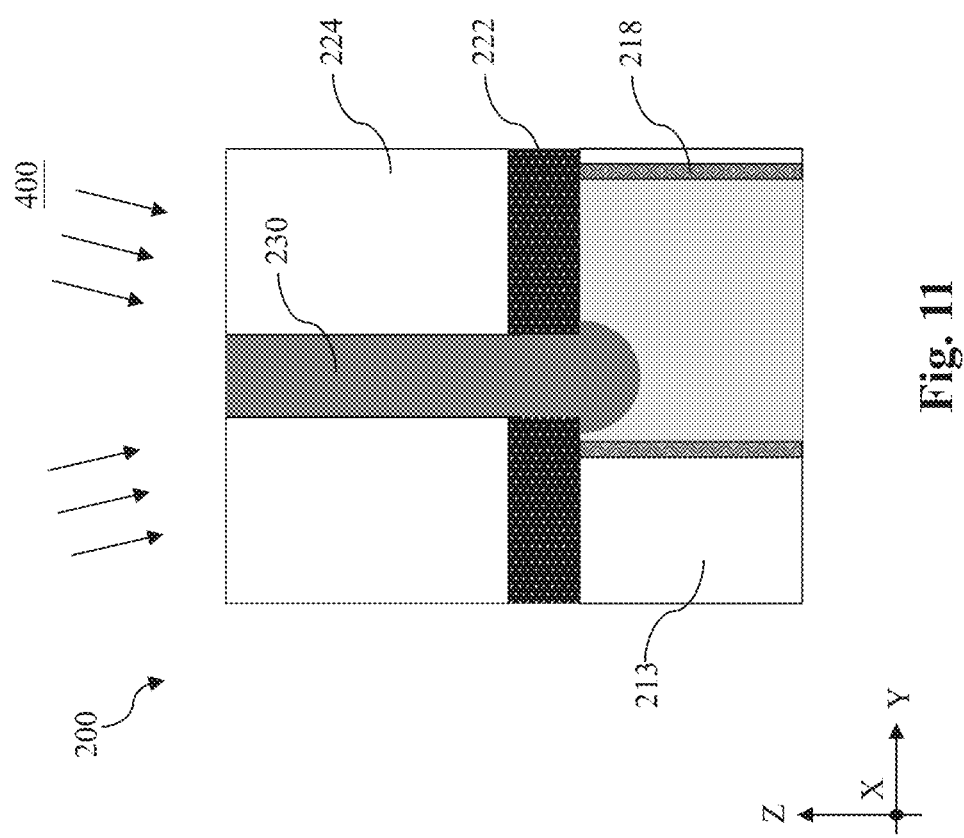
Figure 12:
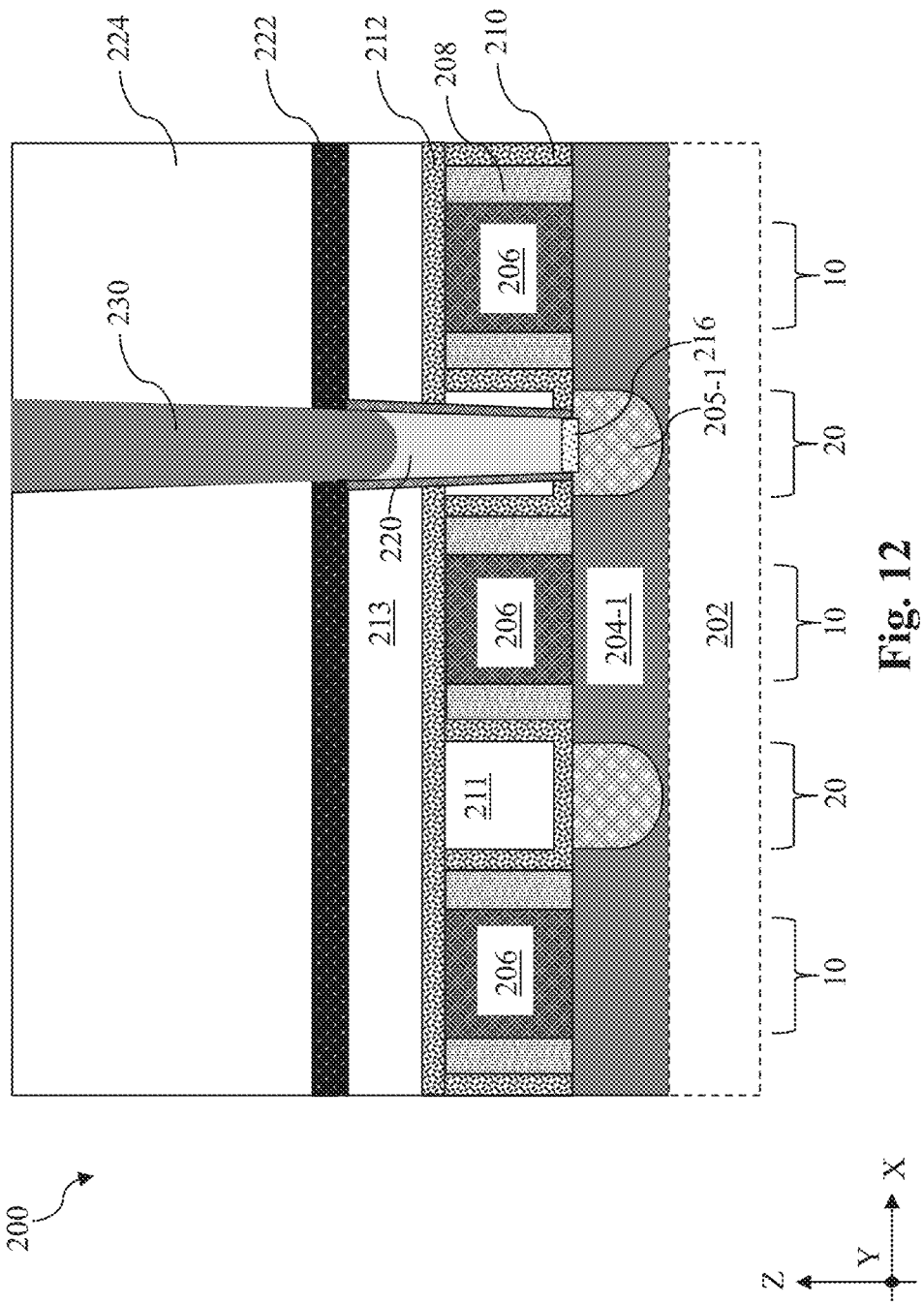

After the first implantation process 300, the first glue layer 234 is deposited over the workpiece 200 to cover the mushroom-like top 232 and the second ILD layer 224, as illustrated in FIG. 9. In some embodiments, the first glue layer 234 may include titanium, titanium nitride, or both using CVD, physical vapor deposition (PVD), or plasma-enhanced CVD (PECVD). In some instances, the first glue layer 234 includes a titanium layer that is deposited using PVD and a titanium nitride layer deposited using CVD and a titanium precursor such as tetrakis(dimethylamido)titanium (TDMAT). The titanium layer may have a thickness between about 40 Å and about 60 Å and the titanium nitride layer may have a thickness between about 10 Å and about 30 Å. Referring to FIG. 10, a buffer layer 236 is then deposited over the first glue layer 234. In an example process to deposit the buffer layer 236, a nucleation layer is first deposited using pulsed CVD or ALD and then a bulk layer is deposited over the nucleation layer using CVD. In some implementations, the buffer layer 236 may include tungsten (W) or a metal similar to the metal fill layer 228. When the buffer layer 236 is formed of tungsten (W), deposition of the buffer layer 236 may include use of tungsten containing precursors, such as tungsten hexafluoride ($WF_6$) or tungsten hexachloride ($WCl_6$). After the deposition of the buffer layer 236, a CMP process is performed to planarize the workpiece 200 to remove excess materials and to form the source/drain contact via 230. The buffer layer 236 functions to create a buffer zone for the planarization process and the first glue layer 234 provides adhesion of the buffer layer to the second ILD layer 224 and the metal fill layer 228. After the planarization and the formation of the source/drain contact via 230, the second implantation process 400 is performed to once again reinforce the interface between the source/drain contact via 230 and the second ILD layer 224. FIG. 12 illustrates the workpiece 200 when viewed down the Y direction.

Referring now to FIGS. 1 and 13, the method 100 includes a block 112 where a gate contact opening 238 is formed through the second ILD layer 224, the first ESL 222, the first ILD layer 213, and the capping layer 212. Formation of the gate contact opening 238 through the second ILD layer 224, the first ESL 222, the first ILD layer 213, the capping layer 212 may include use of lithography processes and/or etching processes. The lithography processes includes forming a resist layer over the second ILD layer 224, exposing the resist layer to pattern radiation, and developing the exposed resist layer, thereby forming a patterned resist layer that can be used as a masking element for etching the gate contact opening 238 to expose at least a portion of the gate structure 206 over a channel region 10 of a second fin 204-2. An example dry etch process for block 112 may include use of nitrogen ($N_2$), hydrogen ($H_2$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the dry etch process, the masking element may be removed by ashing. A wet clean process may be performed to remove debris over the gate structure 206. In some implementations, the wet clean process may include use of 2-anilino-4-methyl-1,3-thiazole- 5-carboxylic acid or isopropyl alcohol (IPA). It is noted that FIG. 13 illustrates the second fin 204-2 while the first fin 204-1 is out of the plane. The source/drain contact via 230 is shown in dotted lines as it either in front of or behind the cross-sectional view in FIG. 13. In the depicted embodiments, the second source/drain contact 2200 is disposed over the second source/drain feature 205-2 in a source/drain region 20 of the second fin 204-2. The source/drain contact via 230 is disposed on the first source/drain contact 220 in front of or behind the cross-sectional view in FIG. 13.

Figure 14:
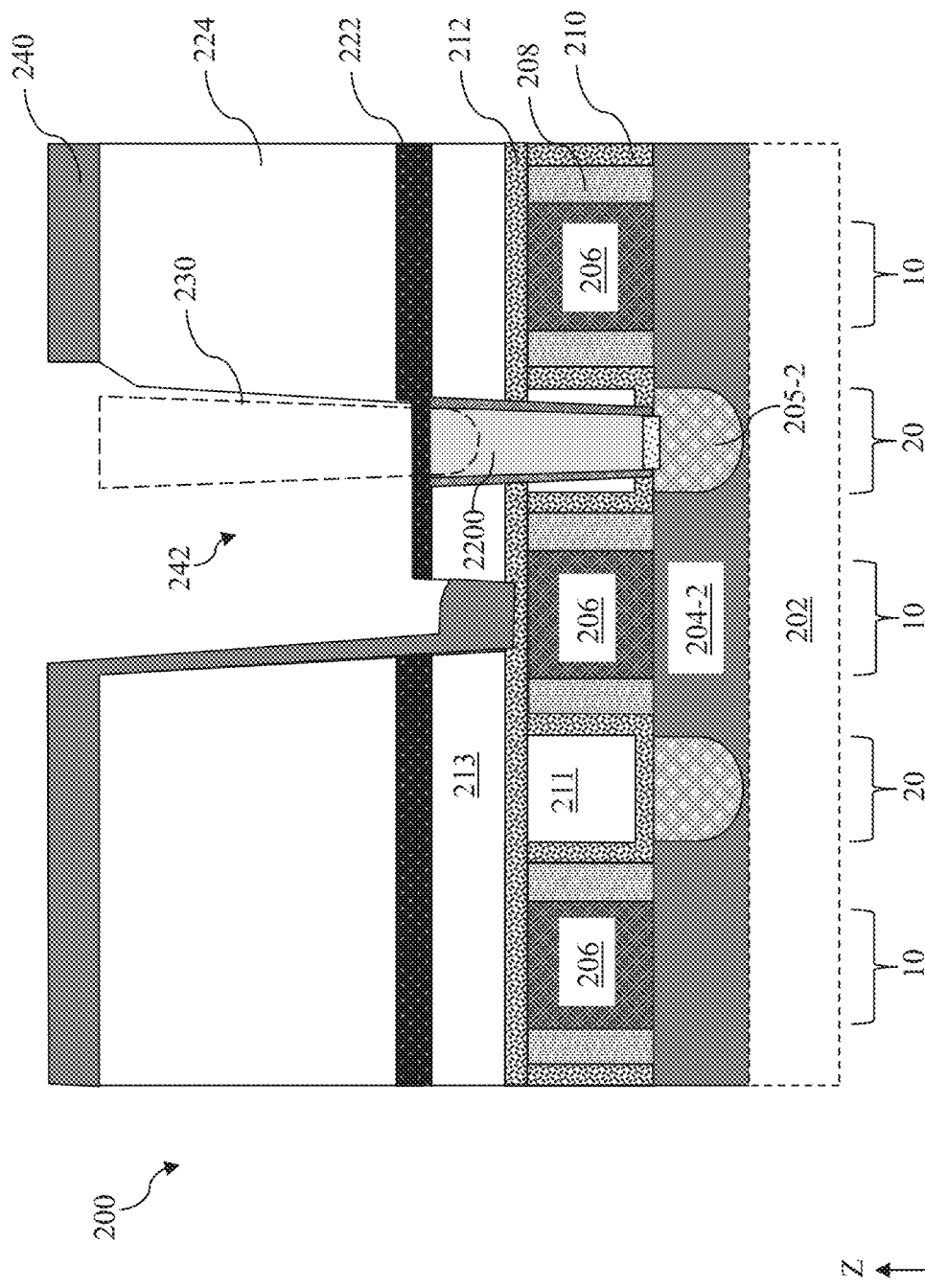

Referring now to FIGS. 1 and 14, the method 100 includes a block 114 where a common rail opening 242 is formed to expose a second source/drain contact 2200. The formation of the common rail opening 242 includes photolithography processes and etch processes. In an example process, a patterned multi-layer mask layer 240 is formed over the workpiece 200. The patterned multi-layer mask layer 240 includes an opening directly over the gate contact opening 238 and the second source/drain contact 2200. The multi-layer mask layer 240 may be a tri-layer having a bottom layer (i.e., a hard mask layer), a middle layer (i.e. a bottom antireflective coating (BARC)) over the bottom layer and a photoresist layer over the middle layer. Using the patterned multi-layer mask layer as an etch mask, the second ILD layer 224 and the first ESL 222 over the second source/drain contact 2200 are etched using a dry etch process until only a thin portion of the first ESL 222 cover the second source/drain contact 2200. An example dry etch process for block 114 may include use of a fluorine-containing gas (e.g., $CF_4$, $SF_6$, $CH_2F_2$, $CHF_3$, and/or $C_2F_6$), a hydrocarbon species (e.g., $CH_4$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 14, the etching of the second ILD layer 224 and the first ESL 222 form the common rail opening 242 that merge with the gate contact opening 238 (shown in FIG. 13). After the dry etch process, the patterned multi-layer mask layer 240 may be removed by ashing and the workpiece 200 is cleaned in a wet clean process that includes use of 2-anilino-4-methyl-1,3-thiazole-5-carboxylic acid or isopropyl alcohol (IPA). The thin portion of the first ESL 222 over the second source/drain contact 2200 functions to protect the first ESL 222 from the wet clean process.

Figure 15:
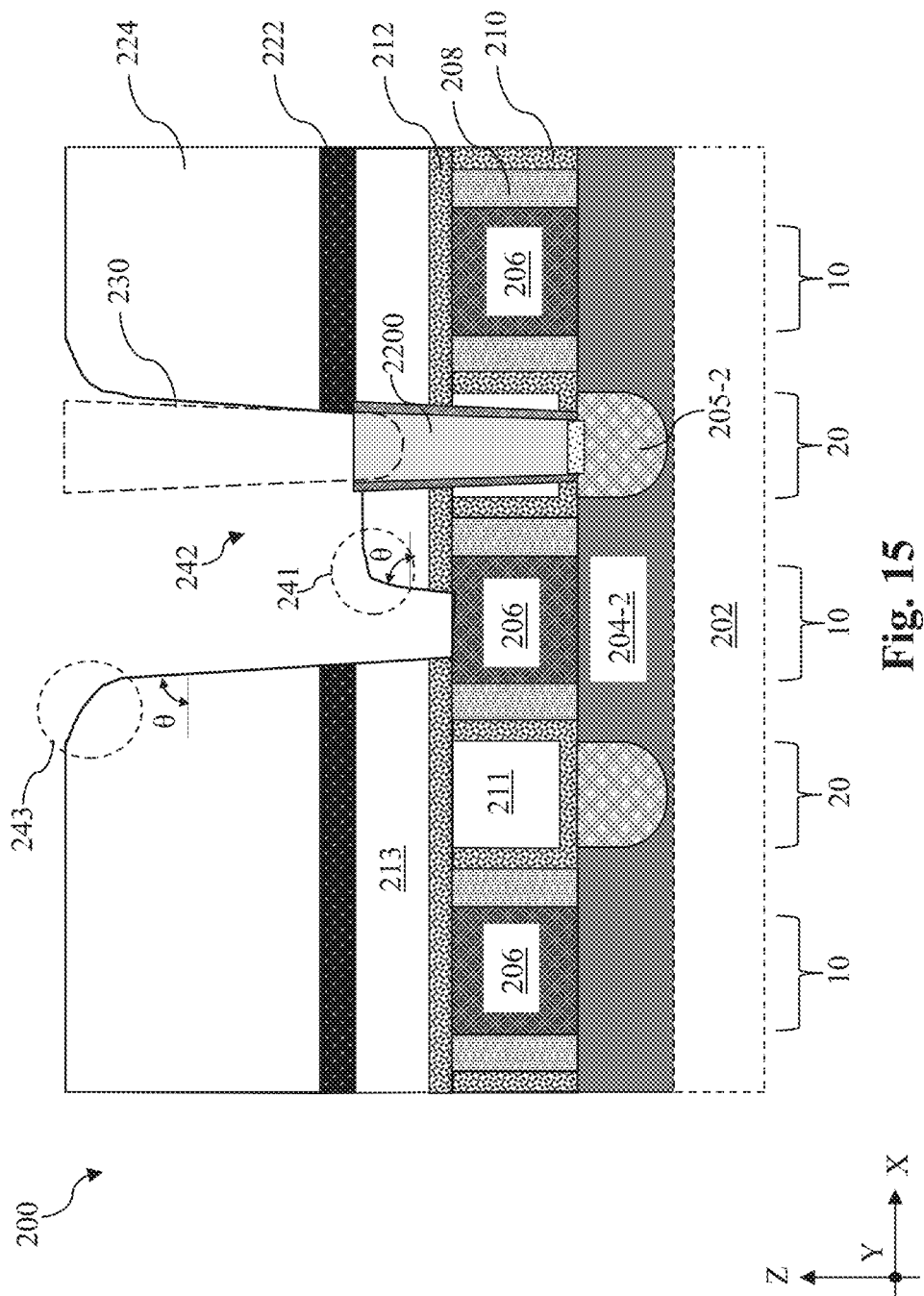

Referring to FIGS. 1 and 15-19, the method 100 includes a block 116 where a common rail contact 248 is formed in the common rail opening 242. Operations at block 116 include a breaching process to expose the second source/drain contact 2200 (shown in FIG. 15), deposition of a second glue layer 244 (shown in FIGS. 16 and 17), deposition of a metal fill layer 246 (shown in FIGS. 16 and 17), and a planarization process to remove excess materials (shown in FIGS. 18 and 19). Referring to FIG. 15, a dry etch process is performed to remove the thin portion of the first ESL 222 to expose a top surface of the second source/drain contact 2200. Because this dry etch process breaches through the first ESL 222, it may be referred to as a breaching process. An example dry etch process at block 116 may include use of nitrogen plasma, a hydrogen plasma, or both. As illustrated in FIG. 15, the dry etch process at block 116 forms a middle rounded corner 241 and a top rounded corner 243. The curvature and the opening angle θ of the middle rounded corner 241 and the top rounded corner 243 may be adjusted by the dry etch process. In some instances, the middle rounded corner 241 and the top rounded corner 243 may have a curvature between about 1.7 and 1.9 and an opening angle θ between 80° and 90°. The presence of the middle rounded corner 241 and the top rounded corner 243 further improves the metal fill window into the common rail opening 242. Because the common rail opening 242 defines the shape of the common rail contact 248, the middle rounded corner 241 and the top rounded corner 243 are reflected in the shape of the common rail contact 248.

Figure 16:
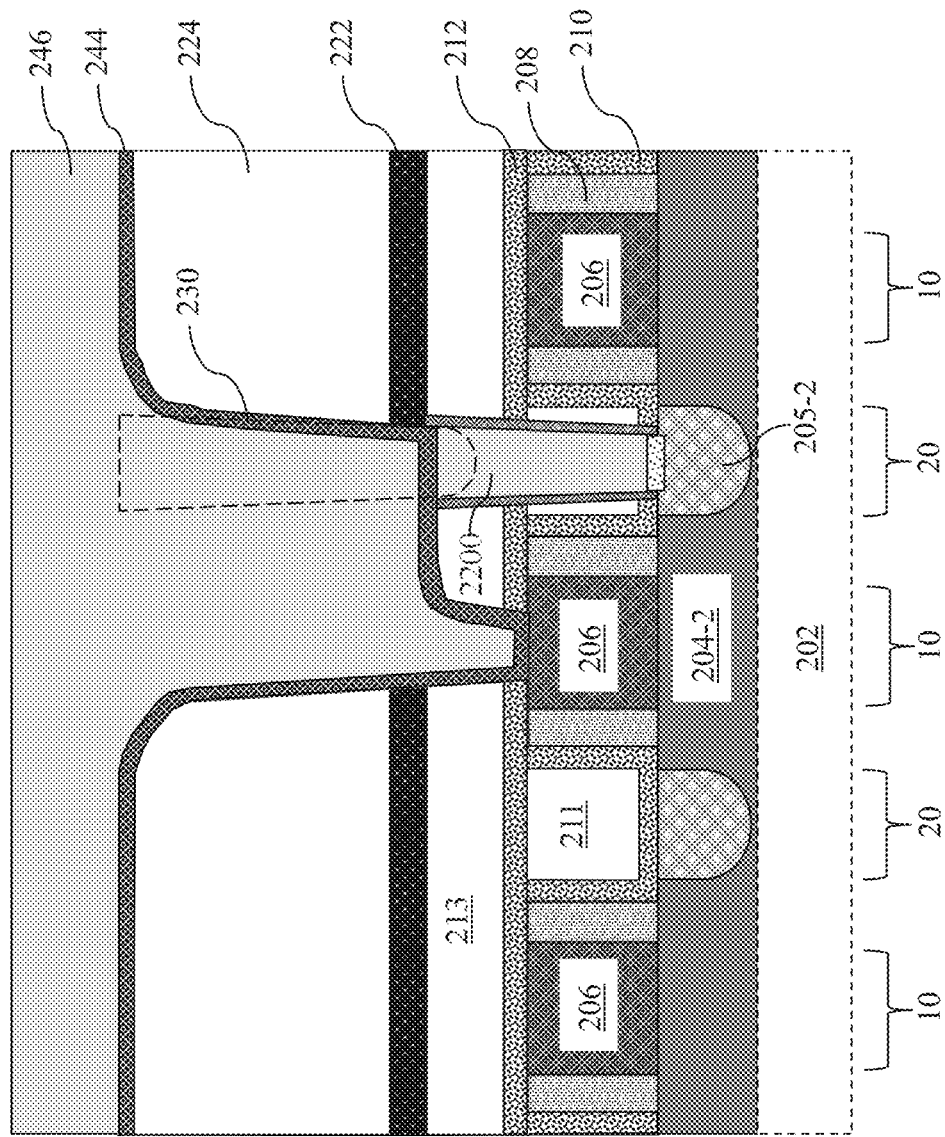
Figure 17:
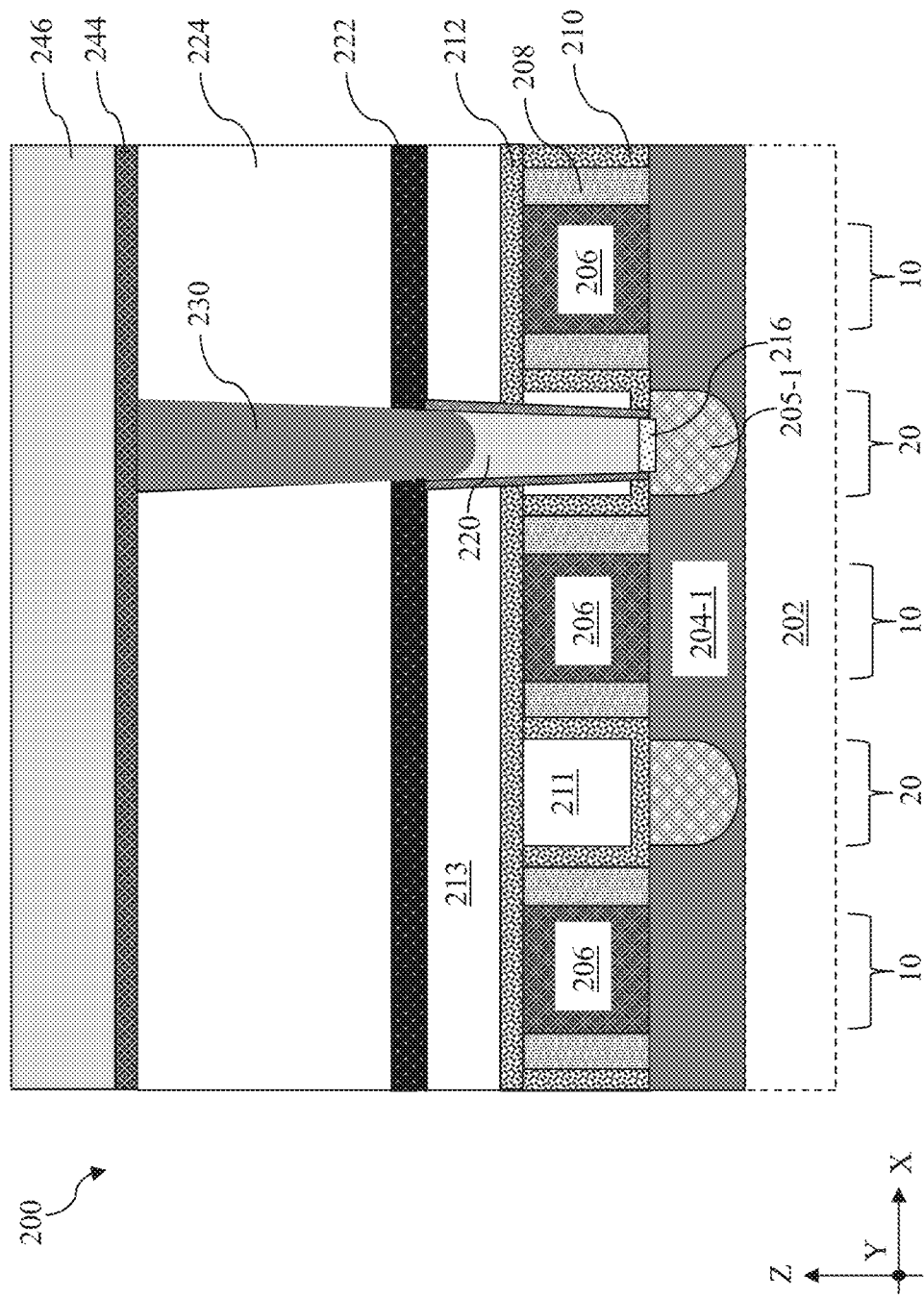

Referring then to FIGS. 16 and 17, with both the gate structure 206 and the second source/drain contact 2200 exposed, the second glue layer 244 is deposited using CVD, physical vapor deposition (PVD), or plasma-enhanced CVD (PECVD). In some implementations, the second glue layer 244 may include a titanium layer deposited using PVD and a titanium nitride layer deposited over the titanium layer using CVD and a titanium precursor such as tetrakis(dimethylamido)titanium (TDMAT). In some instances, the second glue layer 244 has a thickness between about 0.3 nm and about 1.7 nm. Referring still to FIGS. 16 and 17, after the formation of the second glue layer 244, the metal fill layer 246 is deposited over the second glue layer 244. In some embodiments, the deposition of the metal fill layer 246 may include formation of a nucleation layer and a bulk metal layer. In an example process, the nucleation layer may be deposited using pulsed-CVD or ALD and the bulk metal layer may be deposited using CVD. The metal fill layer 246 may include tungsten (W) or ruthenium (Ru). In one embodiment, the metal fill layer 246 includes tungsten (W). When the metal fill layer 246 is formed of tungsten (W), deposition of the metal fill layer 246 may include tungsten hexafluoride ($WF_6$) or tungsten hexachloride ($WCl_6$). FIG. 17 illustrates a fragmentary cross-sectional view that cuts across the first fin 204-1. As shown in FIG. 17, the second glue layer 244 and the metal fill layer 246 are deposited over the source/drain contact via 230.

Figure 18:
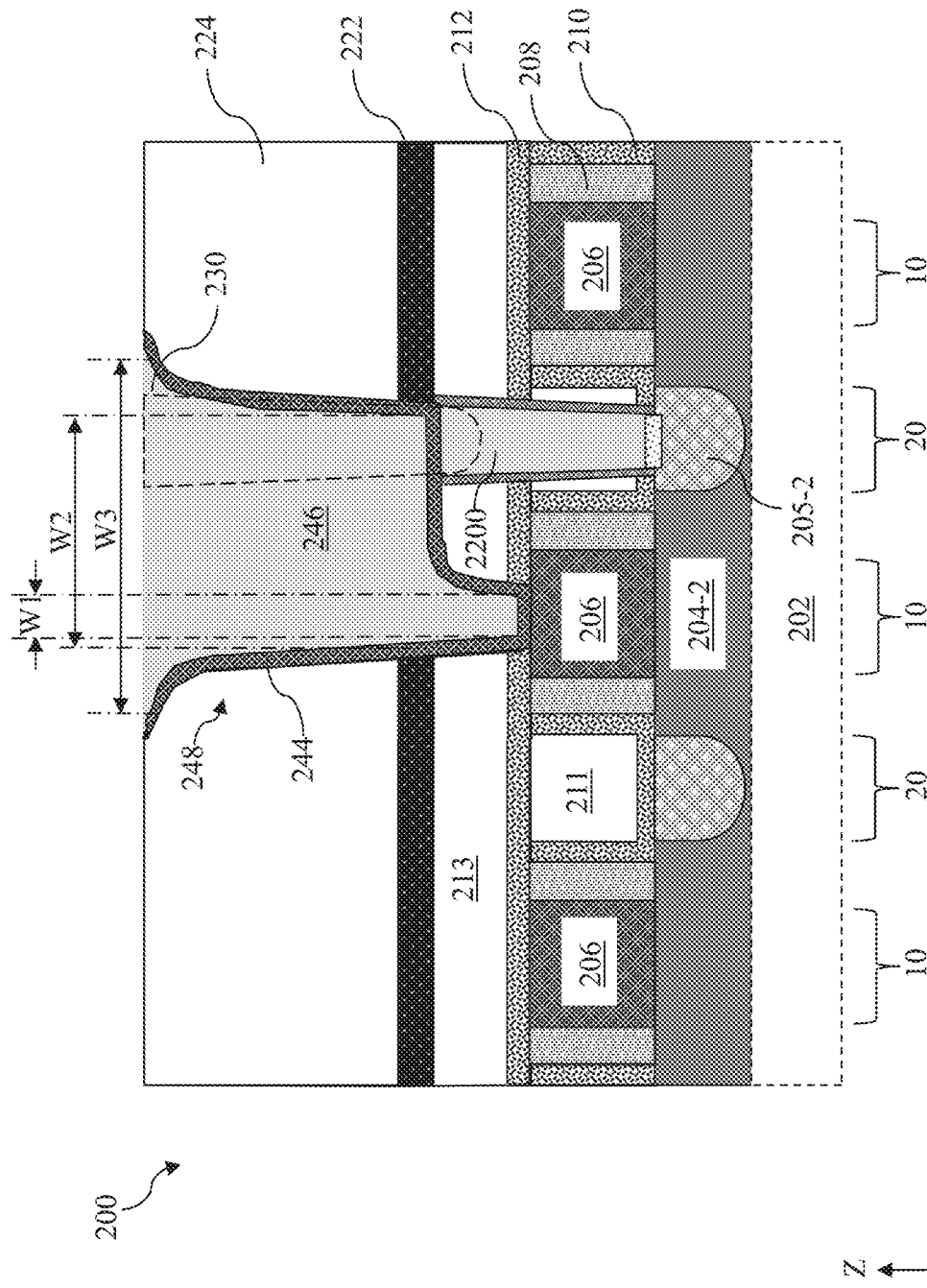
Figure 19:
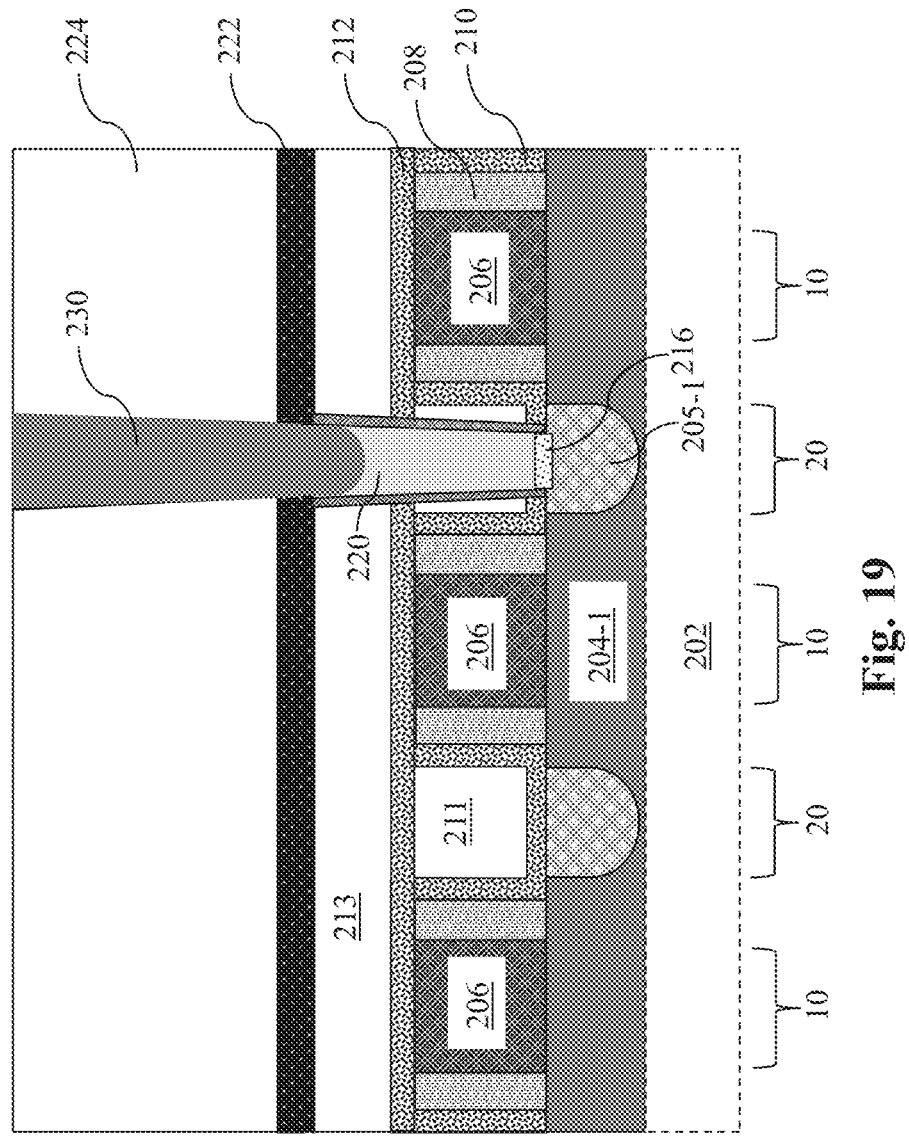

After the deposition of the metal fill layer 246, a CMP process is performed to the workpiece 200 to remove excess materials. At this point, the common rail contact 248 is formed as shown in FIG. 18. Reference is now made to FIGS. 18 and 19. The CMP process at block 116 removes the second glue layer 244 and the metal fill layer 246 over the second ILD layer 224 such that top surfaces of the second ILD layer 224, the source/drain contact via 230, and the common rail contact 248 are coplanar. In some instances, a thickness of the second ILD layer 224 along the Z direction after the CMP process is between about 28 nm and about 34 nm. The common rail contact 248 shorts the second source/drain feature 205-2 to the gate structure 206 adjacent the second source/drain feature 205-2. As illustrated in FIG. 18, when viewed along the Y direction, the common rail contact 248 includes an asymmetric profile. A portion of the common rail contact 248 lands on the second source/drain contact 2200 that is embedded in the first ILD layer 213. Another portion of the common rail contact 248 extends further below through the first ILD layer 213 and the capping layer 212 to reach the gate structure 206. As a whole, the common rail contact 248 vertically extends through the second ILD layer 224, the first ESL 222, the first ILD layer 213, and the capping layer 212. Because the common rail opening 242 is larger than the gate contact opening 238 and the source/drain contact via opening 2260, the metal fill window for the common rail opening 242 is greater than those for the gate contact opening 238 and the source/drain contact via opening 2260.

Reference is made to FIG. 18. Along the lengthwise direction of the second fin 204-2 (i.e., the X direction), the common rail contact 248 includes a first width W1 at the top surface level of the gate structure 206, a second width W2 at the top surface level of the first ESL 222, and a third width W3 at the top surface level of the second ILD layer 224. In some instances, the first width W1 may be between about 11 nm and about 15 nm, the second width W2 may be between about 48 nm and about 54 nm, and the third width W3 may be between about 43 nm and about 78 nm.

The method 100 described above forms the source/drain contact via 230 before the formation of the common rail opening 242 and the common rail contact 248. In some alternative embodiments, the source/drain contact via 230 and the common rail contact 248 may be formed simultaneously. While these alternative embodiments may include lesser steps, the different metal fill windows for the source/drain contact via opening 2260 and the common rail opening 242 may make it more challenging to satisfactorily form the source/drain contact via 230 and the common rail contact 248 using the same deposition processes.

The common rail contacts and methods of the present disclosure provide several benefits. For example, the common rail contact constitutes a low-resistance conduction path for a source/drain feature and an adjacent gate structure. The greater dimensions of the common rail opening result in improved metal fill window. The greater dimension of the common rail contact translates into improved contact resistance. Some methods of the present disclosure form source/drain contact via and the common rail contact separately to accommodate different metal fill windows for the source/drain contact via opening and the common rail opening.

The present disclosure provides for many different embodiments. In one embodiment, a method is provided. The method includes receiving a workpiece that includes a gate structure, a first source/drain feature and a second source/drain feature, a first dielectric layer over the gate structure, the first source/drain feature and the second source/drain feature, a first source/drain contact disposed over the first source/drain feature, a second source/drain contact disposed over the second source/drain feature, a first etch stop layer (ESL) over the first dielectric layer, and a second dielectric layer over the first ESL, forming a source/drain contact via through the second dielectric layer and the first ESL to couple to the first source/drain contact, after the forming of the source/drain contact via, forming a gate contact opening through the second dielectric layer, the first ESL, and the first dielectric layer to expose the gate structure, after the forming of the gate contact opening, forming a common rail opening adjoining the gate contact opening, wherein the second source/drain contact is exposed in the common rail opening, and after the forming the common rail opening, forming a common rail contact in the common rail opening.

In some embodiments, the forming of the source/drain contact via includes etching the first ESL and the second dielectric layer to form a source/drain contact via opening to expose the first source/drain contact, recessing the first source/drain contact to extend the source/drain contact via opening into the first source/drain contact, and after the recessing, depositing a metal fill layer into the source/drain contact via opening. In some instances, the forming of the source/drain contact via further includes after the depositing of the metal fill layer, performing a first implantation process to implant a semiconductor dopant, after the performing of the first implantation process, depositing a glue layer over the metal fill layer, depositing a buffer layer over the glue layer, and after the depositing of the buffer layer, planarizing the workpiece to remove the glue layer and the buffer layer. In some embodiments, the forming of the source/drain contact via further includes after the planarizing, performing a second implantation process to implant the semiconductor dopant. In some instances, the semiconductor dopant includes germanium. In some implementations, the glue layer includes titanium or titanium nitride. In some embodiments, the buffer layer includes tungsten. In some implementations, the depositing of the metal fill layer and the depositing of the buffer layer are performed using different deposition processes.

In another embodiment, a method is provided. The method includes receiving a workpiece that includes a gate structure, a first source/drain feature adjacent the gate structure, a first dielectric layer over the gate structure and the first source/drain feature, a first source/drain contact disposed over the first source/drain feature, a first etch stop layer (ESL) over the first dielectric layer, and a second dielectric layer over the first ESL, forming a gate contact opening through the second dielectric layer, the first ESL, and the first dielectric layer to expose the gate structure, after the forming of the gate contact opening, forming a common rail opening adjoining the gate contact opening, wherein the first source/drain contact is exposed in the common rail opening, and after the forming the common rail opening, forming a common rail contact in the common rail opening.

In some embodiments, the forming of the common rail opening includes forming a patterned photoresist layer over the second dielectric layer, the patterned photoresist layer includng an opening direct over the first source/drain contact and the gate contact opening, etching the first ESL and the second dielectric layer using a first dry etch process and the patterned photoresist layer as an etch mask, wherein the first source/drain contact remains covered by a portion of the first ESL, and after the etching, cleaning the common rail opening using a first wet clean process. In some implementations, the forming of the common rail opening further includes after the cleaning, performing a second dry etch process to remove the portion of the first ESL and to expose the first source/drain contact, and after the performing the second dry etch process, performing a second wet clean process. In some instances, the second dry etch process is different from the first dry etch process. In some implementations, the first dry etch process includes use of hydrocarbons or fluorinated hydrocarbons and the second dry etch process includes use of nitrogen or hydrogen. In some instances, the forming of the common rail contact includes cleaning the common rail opening, depositing a glue layer over the common rail opening, depositing a metal nucleation layer over the glue layer, and depositing a metal fill layer over the metal nucleation layer. In some embodiments, the depositing of the glue layer includes depositing a titanium layer over the common rail opening using physical vapor deposition (PVD); and after the depositing of the titanium layer, depositing a titanium nitride layer using chemical vapor deposition (CVD).

In still another embodiment, a semiconductor structure is provided. The semiconductor structure includes a gate structure, a first source/drain feature adjacent the gate structure, a first dielectric layer over the gate structure and the first source/drain feature, a first etch stop layer (ESL) over the first dielectric layer, a second dielectric layer over the first ESL, a first source/drain contact disposed over the first source/drain feature and extending through the first dielectric layer, and a common rail contact extending through the second dielectric layer, the first ESL, and the first dielectric layer to come in contact with the gate structure. A portion of the common rail contact is disposed on a top surface of the first source/drain contact.

In some embodiments, the common rail contact spans over the first source/drain contact and the gate structure. In some instances, the first source/drain contact includes cobalt and the common rail contact includes a glue layer and a metal fill layer. The glue layer includes a titanium layer and a titanium nitride layer and the metal fill layer includes tungsten. In some embodiments, the semiconductor structure further includes a second source/drain feature, a second source/drain contact that extends through the first dielectric layer to come in contact with the second source/drain feature, and a source/drain contact via that extends through the first ESL and the second dielectric layer to come in contact with the second source/drain contact. The source/drain contact via extends into the second source/drain contact. In some instances, the second source/drain contact via is spaced apart from the common rail contact by the first ESL and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a gate structure,
        a first source/drain feature and a second source/drain feature,
        a first dielectric layer over the gate structure, the first source/drain feature and the second source/drain feature,
        a first source/drain contact disposed over the first source/drain feature,
        a second source/drain contact disposed over the second source/drain feature,
        a first etch stop layer (ESL) over the first dielectric layer, and
        a second dielectric layer over the first ESL;
    forming a source/drain contact via through the second dielectric layer and the first ESL to couple to the first source/drain contact, the forming of the source/drain contact via comprising:
        etching the first ESL and the second dielectric layer to form a source/drain contact via opening to expose the first source/drain contact,
        recessing the first source/drain contact to extend the source/drain contact via opening into the first source/drain contact such that the source/drain contact via opening undercuts the first ESL,
        after the recessing, depositing a metal fill layer into the source/drain contact via opening,
        after the depositing of the metal fill layer, performing a first implantation process to implant a semiconductor dopant,
        after the performing of the first implantation process, depositing a glue layer over the metal fill layer, and depositing a buffer layer over the glue layer;
    after the forming of the source/drain contact via, forming a gate contact opening through the second dielectric layer, the first ESL, and the first dielectric layer to expose the gate structure;
    after the forming of the gate contact opening, forming a common rail opening adjoining the gate contact opening, wherein the second source/drain contact is exposed in the common rail opening; and
    after the forming the common rail opening, forming a common rail contact in the common rail opening.

2. The method of claim 1, wherein the forming of the source/drain contact via further comprises:
    after the depositing of the buffer layer, planarizing the workpiece to remove the glue layer and the buffer layer.

3. The method of claim 2, wherein the forming of the source/drain contact via further comprises:
    after the planarizing, performing a second implantation process to implant the semiconductor dopant.

4. The method of claim 1, wherein the semiconductor dopant comprises germanium.

5. The method of claim 1, wherein the glue layer comprises titanium or titanium nitride.

6. The method of claim 1, wherein the buffer layer comprises tungsten.

7. The method of claim 1, wherein the depositing of the metal fill layer and the depositing of the buffer layer are performed using different deposition processes.

8. The method of claim 1, wherein the metal fill layer is deposited into the source/drain contact via opening in a bottom-up manner such that the deposited metal fill layer comprises a mushroom-like top that rises above the first ESL.

9. A method, comprising:
    receiving a workpiece comprising:
        a gate structure,
        a first source/drain feature adjacent the gate structure,
        a first dielectric layer over the gate structure and the first source/drain feature,
        a first source/drain contact disposed over the first source/drain feature,
        a first etch stop layer (ESL) over the first dielectric layer, and
        a second dielectric layer over the first ESL;
    forming a gate contact opening through the second dielectric layer, the first ESL, and the first dielectric layer to expose the gate structure;
    after the forming of the gate contact opening, forming a common rail opening adjoining the gate contact opening, wherein the first source/drain contact is exposed in the common rail opening, the forming of the common rail opening comprising:
        forming a patterned photoresist layer over the second dielectric layer, the patterned photoresist layer comprising an opening direct over the first source/drain contact and the gate contact opening;
        etching the first ESL and the second dielectric layer using a first dry etch process and the patterned photoresist layer as an etch mask, wherein the first source/drain contact remains covered by a portion of the first ESL; and
        after the etching, cleaning the common rail opening using a first wet clean process;
        after the cleaning, performing a second dry etch process to remove the portion of the first ESL and to expose the first source/drain contact; and
    after the forming the common rail opening, forming a common rail contact in the common rail opening.

10. The method of claim 9,
    wherein the forming of the common rail opening further comprises:

after the performing the second dry etch process, performing a second wet clean process.

11. The method of claim 10, wherein the second dry etch process is different from the first dry etch process.

12. The method of claim 10,
wherein the first dry etch process comprises use of hydrocarbons or fluorinated hydrocarbons,
wherein the second dry etch process comprises use of nitrogen or hydrogen.

13. The method of claim 9, wherein the forming of the common rail contact comprises:
cleaning the common rail opening;
depositing a glue layer over the common rail opening;
depositing a metal nucleation layer over the glue layer; and
depositing a metal fill layer over the metal nucleation layer.

14. The method of claim 13, wherein the depositing of the glue layer comprises:
depositing a titanium layer over the common rail opening using physical vapor deposition (PVD); and
after the depositing of the titanium layer, depositing a titanium nitride layer using chemical vapor deposition (CVD).

15. The method of claim 9, further comprising:
before the forming of the gate contact opening, etching the first ESL and the second dielectric layer to form a source/drain contact via opening to expose the first source/drain contact;
recessing the first source/drain contact to extend the source/drain contact via opening into the first source/drain contact such that the source/drain contact via opening undercuts the first ESL; and
after the recessing, depositing a metal fill layer into the source/drain contact via opening.

16. A semiconductor structure, comprising:
a gate structure disposed over a channel region of a first fin structure;
a first source/drain feature disposed over a source/drain region of the first fin structure adjacent the gate structure;
a second source/drain feature disposed over a source/drain region of a second fin structure different from the first fin structure;
a contact etch stop layer (CESL) over the first source/drain feature and the second source/drain feature;
a bottom dielectric layer disposed over the CESL;
a capping layer disposed over top surfaces of the gate structure, the first source/drain feature, the second source/drain feature, the CESL, and the bottom dielectric layer;
a first dielectric layer over the capping layer;
a first etch stop layer (ESL) over the first dielectric layer;
a second dielectric layer over the first ESL;
a first source/drain contact disposed over the first source/drain feature and extending through the first dielectric layer, the capping layer, the bottom dielectric layer, and the CESL;
a second source/drain contact that extends through the first dielectric layer, the capping layer, the bottom dielectric layer, and the CESL to come in contact with the second source/drain feature;
a source/drain contact via that extends through the first ESL and the second dielectric layer to come in contact with the second source/drain contact; and
a common rail contact extending through the second dielectric layer, the first ESL, the first dielectric layer, and the capping layer to come in contact with the gate structure,
wherein a portion of the common rail contact is disposed on a top surface of the first source/drain contact,
wherein top surfaces of the source/drain contact via and the common rail contact are coplanar.

17. The semiconductor structure of claim 16, wherein the common rail contact spans over the first source/drain contact and the gate structure.

18. The semiconductor structure of claim 16,
wherein the first source/drain contact comprises cobalt,
wherein the common rail contact comprises a glue layer and a metal fill layer,
wherein the glue layer comprises a titanium layer and a titanium nitride layer,
wherein the metal fill layer comprises tungsten.

19. The semiconductor structure of claim 16,
wherein the source/drain contact via extends into the second source/drain contact,
wherein a portion of the source/drain contact via undercuts the first ESL.

20. The semiconductor structure of claim 19,
wherein the first fin structure and the second fin structure extends lengthwise along a first direction,
wherein the source/drain contact via is spaced apart from the common rail contact along a second direction perpendicular to the first direction by the first ESL and the second dielectric layer.

* * * * *